United States Patent
Cheng et al.

(10) Patent No.: US 12,046,658 B2
(45) Date of Patent: Jul. 23, 2024

(54) ELECTRODE FORMATION

(71) Applicant: Micron Technology, Inc., Boise, ID (US)

(72) Inventors: An-Jen B. Cheng, Boise, ID (US); Brenda D. Kraus, Boise, ID (US); Sanket S. Kelkar, Boise, ID (US); Matthew N. Rocklein, Boise, ID (US); Christopher W. Petz, Boise, ID (US); Richard Beeler, Boise, ID (US); Dojun Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 219 days.

(21) Appl. No.: 16/509,204

(22) Filed: Jul. 11, 2019

(65) Prior Publication Data

US 2021/0013318 A1    Jan. 14, 2021

(51) Int. Cl.
| | |
|---|---|
| H01G 4/018 | (2006.01) |
| H01L 21/02 | (2006.01) |
| H01L 21/28 | (2006.01) |
| H01L 29/51 | (2006.01) |
| H10B 12/00 | (2023.01) |
| H01G 4/005 | (2006.01) |

(52) U.S. Cl.
CPC .......... *H01L 29/517* (2013.01); *H01G 4/018* (2013.01); *H01L 21/02156* (2013.01); *H01L 21/02178* (2013.01); *H01L 21/0228* (2013.01); *H01L 21/28194* (2013.01); *H10B 12/30* (2023.02); *H01G 4/005* (2013.01); *H01L 21/02164* (2013.01); *H01L 21/02194* (2013.01)

(58) Field of Classification Search
CPC ................ H01L 23/544; H01L 27/222; H01L 2223/54426; H01L 27/1157; H01L 27/11573; H01L 27/11524; H01L 21/0217; H01L 27/10805; H01L 27/11529; H01L 27/10808; H01L 29/517; H01L 27/1085; H01L 29/402–407; H01L 29/41–42396; H01G 4/33; H01G 4/005; H01G 4/06; H01G 4/018; H01G 9/04; H01G 9/045; H01G 11/22–26; H10B 12/02; H10B 12/03–0387; H10B 12/30–395

See application file for complete search history.

(56) References Cited

U.S. PATENT DOCUMENTS

| | | | |
|---|---|---|---|
| 5,005,102 A * | 4/1991 | Larson | H01L 28/40 257/295 |
| 7,662,693 B2 | 2/2010 | Bhattacharyya | |
| 7,875,529 B2 | 1/2011 | Forbes et al. | |
| 8,274,777 B2 | 9/2012 | Kiehlbauch | |
| 8,344,438 B2 * | 1/2013 | Schroeder | H01L 28/65 257/769 |

(Continued)

FOREIGN PATENT DOCUMENTS

DE    102018108798 A1 *  12/2018  ............. H01L 45/08

*Primary Examiner* — Younes Boulghassoul
*Assistant Examiner* — Quinton A Brasfield
(74) *Attorney, Agent, or Firm* — Brooks, Cameron & Huebsch, PLLC

(57) ABSTRACT

Apparatuses, methods, and systems related to electrode formation are described. A first portion of a top electrode is formed over a dielectric material of a storage node. A metal oxide is formed over the first portion of the electrode. A second portion of the electrode is formed over the metal oxide.

18 Claims, 6 Drawing Sheets

(56) References Cited

U.S. PATENT DOCUMENTS

| | | | | |
|---|---|---|---|---|
| 2002/0153550 | A1* | 10/2002 | An | H01L 28/65 257/296 |
| 2006/0141707 | A1* | 6/2006 | Nam | H01L 21/76834 438/257 |
| 2008/0173927 | A1* | 7/2008 | Sakuma | H01L 29/40114 257/E21.422 |
| 2009/0191685 | A1* | 7/2009 | Lee | H01L 28/91 438/386 |
| 2011/0031586 | A1* | 2/2011 | Kang | H01L 27/0805 257/532 |
| 2012/0126305 | A1* | 5/2012 | Yan | H10B 41/42 257/316 |
| 2012/0211861 | A1* | 8/2012 | Nishihara | H01L 21/76229 257/E21.546 |
| 2013/0335880 | A1* | 12/2013 | Masuda | H01G 4/005 29/25.41 |
| 2018/0375024 | A1* | 12/2018 | Chu | H10N 70/24 |

* cited by examiner

ELECTRODE FORMATION

TECHNICAL FIELD

The present disclosure relates generally to semiconductor devices and methods, and more particularly focus on enhancing electric barrier capability of an existing electrode material and its formation.

BACKGROUND

Memory devices are typically provided as one of the major internal parts of the advanced integrated semiconductor logic circuits for computing, artificial intelligence or other electronic device application. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 1:
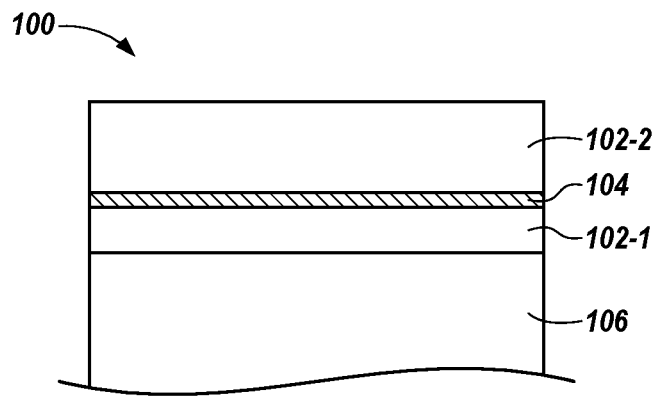
FIGS. 1-3 illustrate example cross-sectional views of an electrode formed on a dielectric material in accordance with a number of embodiments of the present disclosure.

Various types of memory devices, including arrays of volatile and/or non-volatile memory cells (e.g., a memory array), may include thin conductive electrodes, e.g., a top electrode to a capacitor structure. Memory cell dimensionality continues to shrink in order to deliver higher memory density per die area; therefore, for example, the top electrode thickness is commonly around twenty Angstroms (Å) thick. With high-density device shrinking design rules, protecting underlying materials in subsequent semiconductor processing steps is increasingly relevant. For example, protecting a high-k dielectric material underneath or adjacent to a top conducting electrode from damage during subsequent processing steps is relevant to the overall preventing of dielectric damage that eventually turns out to cell leakage control as well as preserving cell capacitance. That is, as the physical size of memory devices decreases, dielectric leakage control becomes increasingly difficult. To reduce dielectric leakage, some embodiments of the present disclosure include depositing a metal oxide material within an electrode.

In some embodiments, the metal oxide material may be Aluminum Oxide (AlOx). While examples in the present disclosure discuss depositing AlOx as a metal oxide barrier in the formation of an electrode on a dielectric material, embodiments are not so limited and may include Silicon Oxide (SiOx), Yttrium Oxide (YOx), Zirconium oxide (ZrOx), Hafnium oxide (HfOx), Germanium oxide (GaOx), Strontium oxide (SrO), Magnesium oxide (MgOx), etc. In the example of AlOx, the AlOx may be deposited in distinct locations within the top electrode. In the example of AlOx, the deposition of the AlOx may protect the underlying dielectric, and in some instances, may increase the conduction band offset (CBO) between the dielectric material and the top electrode.

Fabrication of semiconductor structures, such as storage nodes of a memory device, may involve processing semiconductor wafers, upon which a specific semiconductor structure is being formed, in, i.e., "in-situ", and out of, "ex-situ", a vacuum environment according to a particular semiconductor fabrication sequence and the capability of the current process equipment functional availability. This may include using multiple semiconductor chambers to perform various semiconductor fabrication sequences. A semiconductor wafer, and semiconductor structures formed thereon, may be transported between different semiconductor fabrication apparatuses during a semiconductor fabrication sequence.

Memory devices may include thin layers of metal materials that serve as components of a storage node, such as electrodes to a capacitor structure. For example, in certain architectures, a capacitor cell of a DRAM device may include an electrode, e.g. a top or bottom electrode, comprising a conductive material that is twenty Angstroms (Å) thick, or less. The electrode may comprise a metal material, or a metal containing compound such as Titanium Nitride (TiN) and may be deposited on a dielectric material to form one of two electrodes separated by the dielectric material to form a capacitor cell. Damage to the underlying dielectric may occur in subsequent processing steps in a semiconductor fabrication process as the design rules shrink, thus leading to higher the chance of charges to leak out from the capacitor cell. Cell current leakage may result in false reads of a signal, e.g., charge, stored to a storage node such as a capacitor cell and/or cause short circuits.

Various embodiments of the present disclosure include forming an electrode of a storage node on a dielectric material in a semiconductor fabrication sequence. The electrode is formed to include a metal oxide material that is claimed to protect the dielectric material while the electrode is formed on in subsequent semiconductor fabrication steps and is primarily designed to prevent cell stored charges from leaking from the storage node in use. In one example embodiment, a first portion of an electrode, e.g., top electrode, is deposited on a dielectric material. A metal oxide material is then deposited on the first portion of the electrode. A second portion of the conductive electrode is deposited on the metal oxide material. In one example, just by way of illustration and not by way of limitation, a first portion of Titanium Nitride (TiN) may be deposited as an electrode material on a dielectric material. An Aluminum Oxide (AlOx) material may be deposited on the first portion of the TiN electrode material and a second portion of the TiN may be deposited on the AlOx material to complete the whole electrode composition, e.g., top electrode, on the dielectric material.

It is noted, that while the present disclosure discusses, for example illustration, a process in reference to forming an electrode of a storage node relative to a capacitor cell as a storage node of a dynamic random access memory (DRAM) cell, embodiments are not limited to this example structure, circuitry, or device formation in a semiconductor fabrication sequence. Embodiments may cover forming an electrode on other semiconductor components that benefit from increased leakage control and high work function, such as access lines (e.g., word lines), sense lines (e.g., digit lines, bit lines, etc.), or otherwise conductive surfaces, and devices produced therefrom, formed according to the techniques described herein.

Additionally, or alternatively, shrinking design rules may result in components of semiconductors being formed closer together. And, as design rules shrink, damage to earlier formed structures and materials in subsequent processing steps may become more possible. For example, an adjacent dielectric material damaged in a subsequent processing step may lead to signal, e.g., charge, leakage issues. The issues with protecting the integrity of materials and components together with the proximity of the semiconductor components, as well as the decrease in the size of dielectrics to comport with the shrinking design rules, may increase the instances of charge leaking through a dielectric material. This leakage may cause a weaker signal, e.g., charge, to be maintained or detectable on a storage node and may result in negative effects, such as, inaccurate reads, short circuits, etc. Depositing a metal oxide material into an electrode as described herein may reduce such damage and may reduce, or even eliminate, the leakage caused in part by the shrinking design rules. In some embodiments, the metal oxide material may increase a CBO between the dielectric material and a first portion of the electrode. As such, more energy may be needed for charge to transport from the electrode to the dielectric, thereby increasing the energy barrier results in increasing the amount of energy required for charges to travel through the dielectric. This may decrease the amount of leakage through the dielectric material without significantly impacting the conductivity of the electrode.

The present disclosure includes methods, apparatuses, and systems related to forming a top electrode to reduce damage and/or leakage through an underlying dielectric material. An example of a method described herein includes forming a first portion of a top electrode of a storage node on a dielectric material, forming a metal oxide material on the first portion of the top electrode, and forming a second portion of the top electrode on the metal oxide material. Apparatus embodiments may include a first portion of an electrode deposited over a dielectric material. A metal oxide material may be deposited over the first portion of the electrode and a second portion of the electrode may be deposited over the metal oxide material.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something may refer to one or more such things. For example, a number of capacitors may refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 104 may reference element "04" in FIG. 1, and a similar element may be referenced as 204 in FIG. 2. Multiple analogous elements within one figure may be referenced with a reference numeral followed by a hyphen and another numeral or a letter. For example, 102-1 may reference element 02-1 in FIGS. 1 and 102-2 may reference element 02-2, which may be analogous to element 102-1. Such analogous elements may be generally referenced without the hyphen and extra numeral or letter. For example, elements 102-1 and 102-2 or other analogous elements may be generally referenced as 102.

Figure 2:
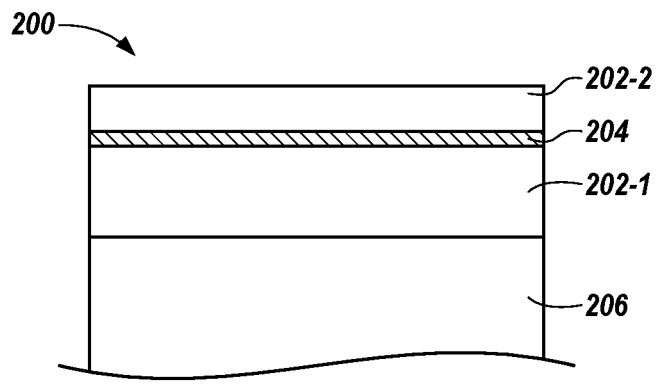
Figure 3:
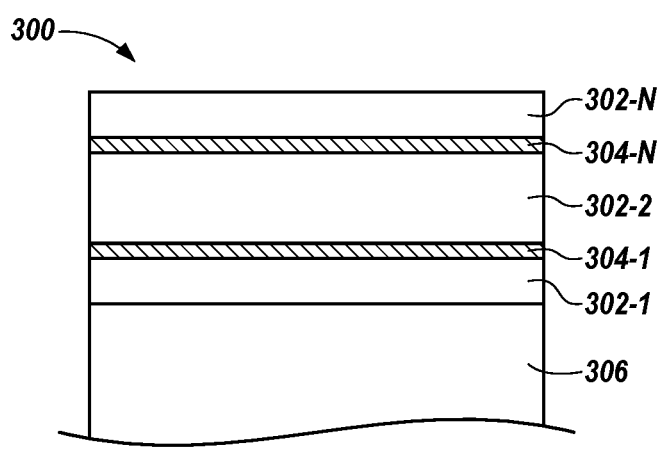

FIGS. 1-3 illustrate example cross-sectional views of an electrode of a storage node formed on a dielectric material in accordance with a number of embodiments of the present disclosure. In an example, the electrode may be a top electrode of a capacitor cell formed on a dielectric material. FIG. 1 illustrates an apparatus 100 comprising a first portion of a top electrode 102-1 and a second portion of a top electrode 102-2, individually or collectively referred to as top electrode 102, a metal oxide material 104, and a dielectric material 106.

The top electrode 102 may be formed from a variety of materials. An electrode may be an electrical conductor. A top electrode may be used to conduct electricity for a semiconductor component. In one embodiment, the top electrode may be formed from titanium nitride (TiN). In other embodiments, the top electrode may be aluminum nitride (AlN), tungsten nitride (WN), molybdenum nitride (MN), ruthenium nitride (RuN), etc., and/or combinations or compounds thereof. Thus, nonlimiting examples of the top electrode 102 may include platinum (Pt), ruthenium (Ru), titanium nitride (TiN), tungsten (W), molybdenum (Mo), tantalum nitride (TaN), aluminum (Al), rhodium (Rh), tungsten nitride (WN), and ruthenium oxide (RuO).

The electrode 102 may be formed in contact with the dielectric material 106. Nonlimiting examples of a dielectric material may include nitrides, oxides and/or combinations or compounds thereof.

According to some embodiments, a metal oxide material 104 may be deposited on a portion of the electrode 102. A metal oxide is a chemical compound formed from a combination of metals and oxygen. Nonlimiting examples of metal oxides may include yttrium oxide (YOx), silicon oxide (SiOx), germanium oxide (GeOx), zirconium oxide (ZrOx), hafnium oxide (HfOx), strontium oxide (SrOx), magnesium oxide (MgOx), and calcium oxide (CaO). In some embodiments, the metal oxide 104 may be formed from AlOx. The AlOx may be deposited ex-situ. In some embodiments, the metal oxide 104 may be deposited on a first portion of the electrode 102.

In some embodiments, the electrode 102, dielectric 106, and the metal oxide 104 may be deposited using chemical vapor deposition (CVD). CVD is a vacuum deposition method wherein the wafer is exposed to one or more volatile precursors which react and/or decompose on the wafer surface to produce the desired deposit. In some embodiments, the electrode 102, dielectric 106, and metal oxide 104 may be deposited using atomic layer deposition (ALD). ALD is a subclass of CVD. During ALD, a material is repeatedly exposed to separate precursors that react with the surface of the material one at a time in a sequential manner. Through these exposures, a thin film is slowly deposited.

In some embodiments, the first portion of the electrode 102-1 may be deposited in-situ. The first portion of the electrode 102-1 may be removed from the vacuum chamber, and the metal oxide 104 may be deposited on the first portion of the electrode 102-1 ex-situ. Once the metal oxide 104 has been deposited, the first portion of the electrode 102-1 and the metal oxide 104 may be placed in the vacuum chamber to deposit a second portion of the electrode 102-2 in-situ. In some embodiments, the electrode 102 may be deposited ex-situ. In some embodiments, the metal oxide 104 may be deposited in-situ.

Depositing the metal oxide 104 with the electrode 102 may protect the dielectric material 106 from damage during subsequent processing steps and may decrease voltage leakage of a storage node. In some embodiments, the voltage leakage may be decreased for a variety of reasons including increasing the work function, increasing an electron barrier, and increasing the band gap at an interface of the electrode 102.

For example, charge leakage may be decreased by increasing the work function of the electrode 102. The work function of a material is the minimum amount of energy needed to eject an electron from the surface of the material. Increasing the work function may alleviate the issue of leakage since increasing the work function may decrease the chance of charge moving through the dielectric 106.

Charge leakage may be decreased by increasing the band gap offset of different materials. The band gap offset is the difference between energy bands of different semiconductor materials at a semiconductor heterojunction, e.g., an interface. A band gap is an energy range where no electron states may exist. Increasing the band gap may increase the amount of energy needed for an electron to move to a different energy band. Therefore, increasing the band gap offset may increase the amount of energy necessary for electrons to flow through a material. This may increase the amount of energy required for charge to flow through a material. Increasing the amount of energy necessary for electricity to flow through a material may decrease leakage because it may take higher levels of energy for the charge to leak through a material.

Depositing the metal oxide 104 into the electrode 102 may increase the conduction band offset between first portion of electrode 102-1 and the dielectric 106. The metal oxide 104 may decrease the electron density in the areas of the electrode 102 that surround the metal oxide 104. Depositing the metal oxide 104 into the electrode 102 may form an electropositive region between the electrode 102 and the dielectric 106. The electrons may move away from this region leaving a well between the metal oxide 104 and the dielectric 106. This may result in an increased band gap offset between the first portion of the electrode 102-1 and the dielectric 106.

The metal oxide 104 may be deposited into a distinct area of the electrode 102. The metal oxide 104 may be deposited as layer. In some embodiments, the metal oxide may be deposited as a discontinuous layer. As used herein, a discontinuous layer may be a layer of metal oxide 104 that may have gaps in the layer. The gaps may allow the first and second portions of the electrode 102 to contact each other. In some embodiments, the metal oxide 104 may be deposited into an area of the electrode 102 so that the second portion of the electrode 102-2 is thicker than the first portion of the electrode 102-1. In some embodiments, the leakage protection may increase when the distance between the metal oxide 104 the dielectric 106 decreases.

The dielectric 106 may be deposited before the electrode 102. The dielectric 106 may act as an insulator to impede unintended electrical conduction between elements of the storage node. In some embodiments, the dielectric 106 may possess a high dielectric constant (k). Forming dielectric 106 to have a high k may increase the capacitance of the capacitors in the storage node. As stated above, depositing the metal oxide 104 into the electrode 102 may increase the band gap offset between the electrode 102 and the dielectric 106. Increasing the band gap offset may increase the amount of energy used to cause an electron to transport through an electrical boundary, e.g., to cause an electron to move through a material interface. Therefore, increasing the band gap offset between the electrode 102 and the dielectric 106 may decrease the amount of leakage in the storage node.

In the example of FIG. 1, a thickness (t1) of a first portion of the electrode 102-1 between the metal oxide material 104 and the dielectric 106 is less than a thickness (t2) of a second portion of the electrode 102-2. As such, the metal oxide material 104 is formed in a lower half of the electrode 102, closer to the interface with the dielectric 106 than to an upper surface of the electrode 102.

FIG. 2 illustrates an example cross-sectional view of a top electrode of a capacitor cell formed on a dielectric material in accordance with a number of embodiments of the present disclosure. The apparatus 200 and components thereof may be analogous to apparatus 100 and components thereof illustrated in FIG. 1. FIG. 2 illustrates first portion of an electrode 202-1 and a second portion of an electrode 202-2, individually or collectively referred to as electrode 202, a metal oxide 204, and a dielectric material 206.

As illustrated in FIG. 2, an electrode 202 may be deposited over a dielectric 206. The dielectric 206 may be a high k dielectric. The metal oxide 204 may be deposited into the electrode 202. In the example of FIG. 2, a first portion of the electrode 202-1 is deposited over the dielectric 206. A metal oxide 204 is deposited over the first portion of the electrode 202-1 and a second portion of the electrode 202-2 is deposited over the metal oxide 204. As shown in FIG. 2, the metal oxide 204 may be deposited such that the first portion of the electrode 202-1 has a greater thickness than the second portion of the electrode 202-2. As such, the metal oxide material 204 is formed in an upper half of the electrode 202, closer to the upper surface of the electrode than the interface to the dielectric 206. In some embodiments, the metal oxide 204 may also be deposited such that the thickness of the metal oxide 204 may be ten percent (10%) to fifteen percent (15%) of the thickness of the electrode 202.

FIG. 3 illustrates an example cross-sectional view of a top electrode of a capacitor cell formed on a dielectric material in accordance with a number of embodiments of the present disclosure. The apparatus 300 and components thereof may be analogous to apparatus 100 and components thereof illustrated in FIG. 1. FIG. 3 illustrates portions of an electrode 302-1, 302-2, . . . , 302-N, individually or collectively referred to as electrode 302, metal oxides 304-1, . . . , 304-N, individually or collectively referred to as metal oxide 304, and a dielectric material 306.

As illustrated in FIG. 3, the metal oxide 304 may be deposited into multiple distinct locations of the electrode 302. In some embodiments, a metal oxide 304-1 may deposited over a first portion of the electrode 302-1. The metal oxide 304-1 may be deposited as a layer of material. In some embodiments, metal oxide 304-1 may be deposited as a discontinuous layer of material. A second portion of electrode 302-2 may be deposited over the metal oxide 304-1. A metal oxide 304-N may be deposited over the second portion of the electrode 302-2. In some embodiments, a metal oxide 304-N may be deposited as a discontinuous layer. A third portion of the electrode 302-N may be deposited over the metal oxide 304-N. The metal oxide 304 may be deposited into the electrode 302 at more numerous distinct locations than shown in FIG. 3.

Figure 4A:
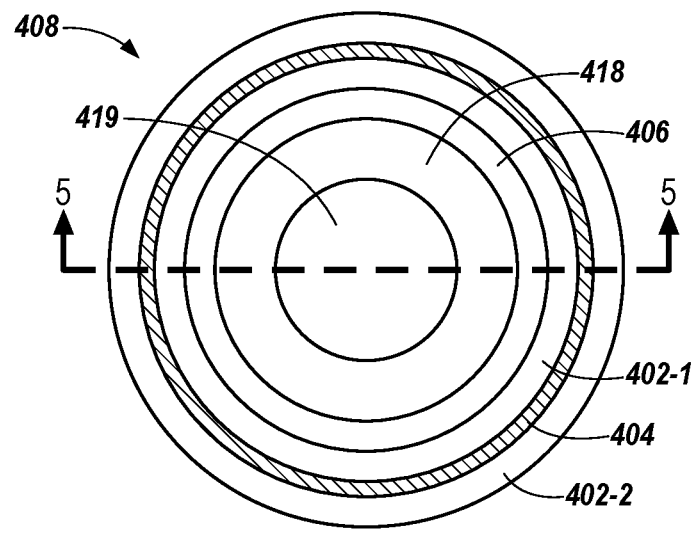
FIGS. 4A-4B illustrate example top-down views of storage nodes in accordance with a number of embodiments of the present disclosure.
Figure 4B:
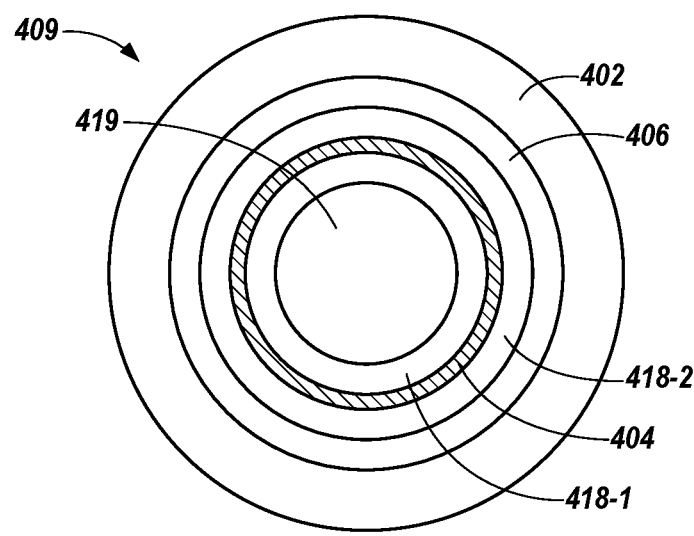

FIGS. 4A-4B illustrate example top down views of storage nodes in accordance with a number of embodiments of the present disclosure. FIGS. 4A-4B illustrate the storage nodes 408, 409 as capacitors 408, 409. However, embodiments of the present disclosure are not limited to capacitors as storage nodes.

FIG. 4A illustrates a single-sided capacitor 408 in which a bottom electrode 418 may be formed in contact with a fill material 419. Non-limiting examples of the fill material 419 include polysilicon nitride, titanium nitride, tungsten, and doped versions thereof. A dielectric material 406 may be formed in contact with the bottom electrode 418. The dielectric material 406 may be a high k dielectric material. The first portion of the top electrode 402-1 may be formed in contact with the dielectric material 406. A metal oxide material 404 may be formed on the first portion of the top electrode 402-1. A second portion of the top electrode 402-2 may be formed on the metal oxide material 404.

FIG. 4B illustrates a single-sided capacitor 409 in which a first portion of a bottom electrode 418-1 may be formed in contact with a fill material 419. A metal oxide material 404 may be formed on top of the first portion of the bottom electrode 418-1. The second portion of the bottom electrode 418-2 may be formed on the metal oxide material 404. The dielectric material 406 may be formed on the second portion of the bottom electrode 418-2. The top electrode 402 may be formed on the dielectric material 406.

Figure 5:
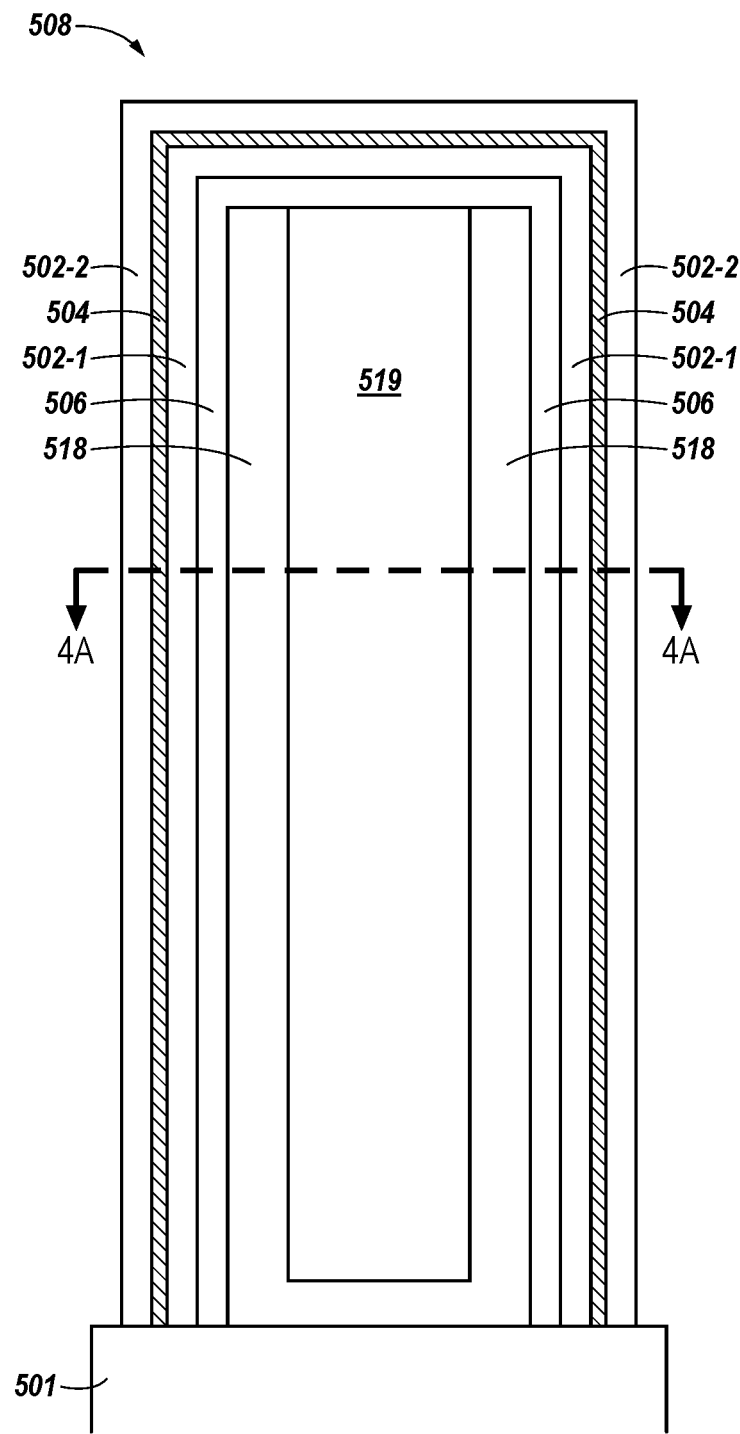
FIG. 5 illustrates an example cross-sectional side view of a storage node in accordance with a number of embodiments of the present disclosure.

FIG. 5 illustrates an example cross-sectional side view of a storage node in accordance with a number of embodiments of the present disclosure. FIG. 5 illustrates storage node 508 as capacitor 508, a first portion of a top electrode 502-1, a second portion of a top electrode 502-2, individually or collectively referred to as top electrode 502, dielectric material 506, bottom electrode 518, a fill material 519, and a substrate material 501. However, embodiments of the present disclosure are not limited to capacitors as storage nodes.

FIG. 5 illustrates a single-sided capacitor 508 in which a bottom electrode 518 may be formed in contact with a fill material 519. A dielectric material 506 may be formed in contact with the bottom electrode 518. In some embodiments, the dielectric material 506 may be a ZrOx material. The first portion of the top electrode 502-1 may be formed in contact with the dielectric material 506. The metal oxide 504 may be formed over the first portion of the electrode 502-1. The second portion of the electrode 502-2 may be formed over the metal oxide 504. Nonlimiting examples of the top electrode 502 may include platinum (Pt), ruthenium (Ru), titanium nitride (TiN), tungsten (W), molybdenum (Mo), tantalum nitride (TaN), aluminum (Al), rhodium (Rh), tungsten nitride (WN), molybdenum nitride (MoN), and ruthenium oxide (RuO).

The bottom electrode 518 may be formed in contact with a substrate material 510. The fill material 519 may be formed within a cavity formed by the bottom electrode 518. The dielectric material 506 may be formed in contact with the bottom electrode 518 and the fill material 519. The top electrode 502 may be formed in contact with the dielectric material 506.

Figure 6:
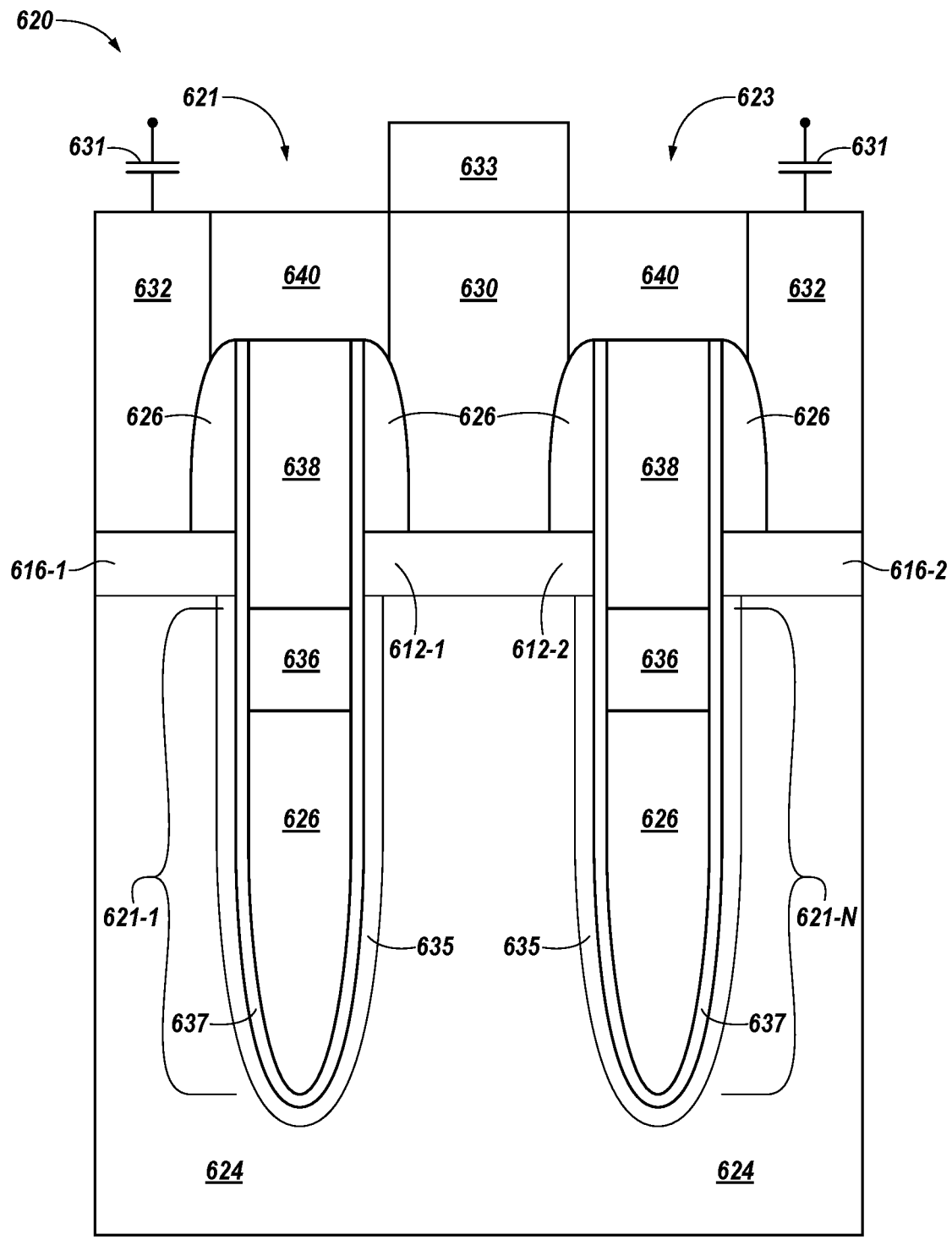
FIG. 6 illustrates a cross-sectional view of an access device which may be coupled to a storage node having an electrode in accordance with a number of embodiments of the present disclosure.

FIG. 6 illustrates a cross-sectional view of a memory cell including access devices coupled to storage nodes in accordance with a number of embodiments of the present disclosure. According to some embodiments, the memory cell structures include electrodes formed in accordance with the techniques described herein. For example, the storage nodes may include capacitors having electrodes formed in accordance with the techniques described herein.

FIG. 6 illustrates an apparatus 620 having gates 621-1, . . . , 621-N, individually or collectively referred to as gate 621. The gate 621 may also be referred to as a gate electrode. The gate 621 may be a gate to a recessed access device, e.g., a buried recessed access device (BRAD). In the example shown, the gate 621 may include a first portion 626 including a metal, e.g., titanium nitride (TiN), and a second portion 636 including a doped polysilicon to form a hybrid metal gate (HMG) 621. The gate 621 may be separated from a channel 635, separating a first source/drain region 616-1 and 616-2, collectively referred to as first source/drain region 616, and a second source/drain region 612-1 and 612-2, collectively referred to as second source/drain region 612, by a gate dielectric 637. In the example of FIG. 6, two neighboring access devices 621 and 623 are shown sharing a second source/drain region 612 at a junction. The neighboring access devices 621 and 623 are built into a substrate material 624.

In the example of FIG. 6, a storage node 631, having an electrode formed in accordance with the techniques described herein, may be coupled to the second source/drain region 612. An insulation material 640 (e.g., a dielectric material) may be formed on the spacer material 626 and the gate mask material 638, and in contact with the metallic material 630. In at least one embodiment, the metallic material 630 may be formed in contact with the spacer material 626, the source/drain regions 612 and 616, and the junction. The insulation material 640 may be formed on the spacer material 626 and the gate mask material 638, and in contact with the metallic material 630.

Figure 7:
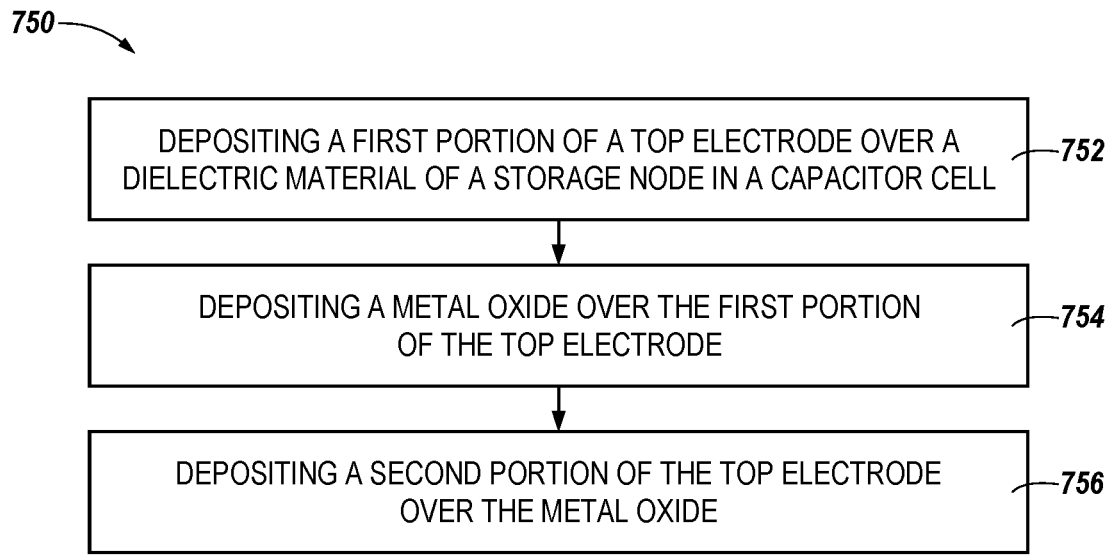
FIG. 7 illustrates a flow diagram of an example method for forming an electrode in a capacitor cell in accordance with a number of embodiments of the present disclosure.

FIG. 7 illustrates a flow diagram of an example method 750 for forming an electrode in a capacitor cell in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 752, the method 750 may include depositing a first portion of a top electrode over a dielectric material of a storage node in a capacitor cell. The dielectric material may be a high k dielectric material. The dielectric material may be formed out of a zirconium based material.

At block 754, the method 750 may include depositing a metal oxide over the first portion of the top electrode. The metal oxide may be deposited to a thickness in a range of 0-5 Å. The metal oxide may be deposited using chemical vapor deposition (CVD). In some embodiments, the metal oxide may be deposited using atomic layer deposition (ALD). In some embodiments, the metal oxide may be deposited using multiple cycles of ALD. In some embodiments, the metal oxide may be deposited using a conformal deposition. The metal oxide may be deposited to reduce charge leakage in a capacitor cell.

At block 756, the method 750 may include depositing a second portion of the top electrode over the metal oxide. The top electrode may be deposited to a thickness of 0-40 Å. In some embodiments, a first portion of the top electrode may be deposited to a thickness that is less than a thickness of a second portion of the top electrode. In some embodiments, the first portion of the top electrode may be deposited to a thickness that is greater than the thickness of the second portion of the top electrode.

Figure 8:
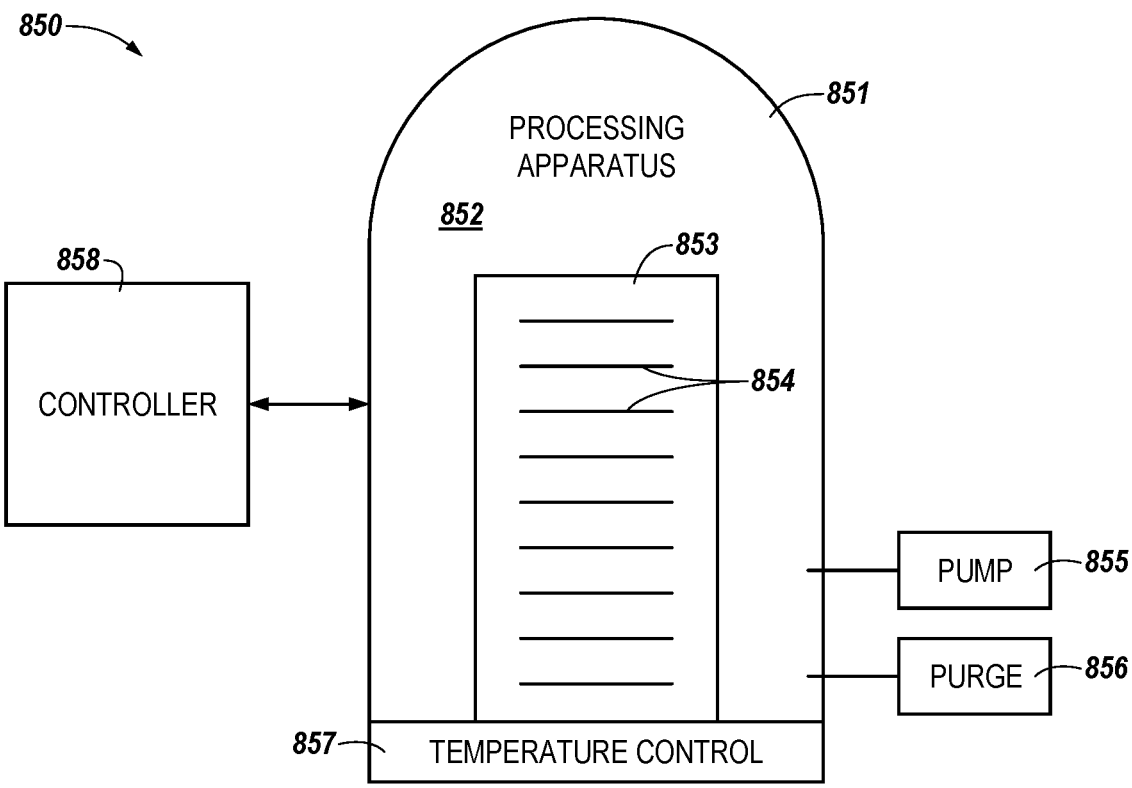
FIG. 8 is a functional block diagram of a system for implementation of an example semiconductor fabrication process in accordance with a number of embodiments of the present disclosure.

FIG. 8 illustrates an example processing apparatus 851 that may be used in a semiconductor fabrication process. The numbering convention used in connection with FIG. 8 does not follow the earlier introduced numbering convention and sequence that applies to FIGS. 1-7. The processing apparatus 851 may include a chamber 852 to enclose components configured to perform deposition and/or etch operations on a number of semiconductor devices. The chamber 852 may further enclose a carrier 853 to hold a batch of semiconductor wafers 854. The processing apparatus 851 may include and/or be associated with tools including, for example, a pump 855 unit and a purge 856 unit configured to introduce and remove appropriate etch chemistries, as described herein, at each point in the semiconductor fabrication sequence. The processing apparatus 851 may further include a temperature control 857 unit configured to maintain the chamber 852 at an appropriate temperature at each of the points in the fabrication sequence. The system 850 may include a number of chambers 852 that are each configured to perform particular processes (e.g., a wet etch process, a dry etch process, and/or a deposition process, among others) during the fabrication sequence.

The system 850 may further include a controller 858. The controller 858 may include, or be associated with, circuitry and/or programming for implementation of, for instance, depositing multiple portions of a top electrode. In some embodiments, the top electrode may be deposited over a high k dielectric material. Adjustment of such deposition, removal, and etching operations by the controller 858 may control the critical dimensions (CDs) of the semiconductor devices created in the processing apparatus 851.

A host may be configured to generate instructions related to protection of a top region of a pillar and an adjacent trench during removal of a substrate material at a bottom region of a trench of the semiconductor device. An example of a host is shown at 958 in FIG. 9, although embodiments are not limited to being coupled to the memory system 962 shown in FIG. 9. The instructions may be sent via a host interface 960 to the controller 858 of the processing apparatus 851. The instructions may be based at least in part on scaled preferences (e.g., in numerically and/or structurally defined gradients) stored by the host 958, provided via input from another storage system (not shown), and/or provided via input from a user (e.g., a human operator), among other possibilities. The controller 858 may be configured to enable input of the instructions and scaled preferences to define the CDs of the fabrication of the semiconductor device to be implemented by the processing apparatus 851.

The scaled preferences may determine final structures (e.g., the CDs) of the top region of the pillar, a sidewall of the pillar, a width of the pillar, a width of the trench, and/or a depth of the trench. Particular CDs may be enabled by the particular scaled preferences that are input via the instructions. Receipt and implementation of the scaled preferences by the controller 858 may result in corresponding adjustment, by the processing apparatus 851, of a deposition time for the electrode, adjustment of a coverage area, height, and/or volume of the electrode, adjustment of a trim direction and/or trim time performed on the electrode, and/or adjustment of punch etch direction and/or punch etch time performed on the substrate material, among implementation of other possible scaled preferences.

The controller 858 may, in a number of embodiments, be configured to use hardware as control circuitry. Such control circuitry may, for example, be an application specific integrated circuit (ASIC) with logic to control fabrication steps, via associated deposition and etch processes, for pillar formation adjacent a trench, along with formation of the electrode on and removal of the electrode from the pillar and the trench.

The controller 858 may be configured to receive the instructions and direct performance of operations to perform a deposition of a metal oxide into a top electrode as described in connection with FIG. 7.

Figure 9:
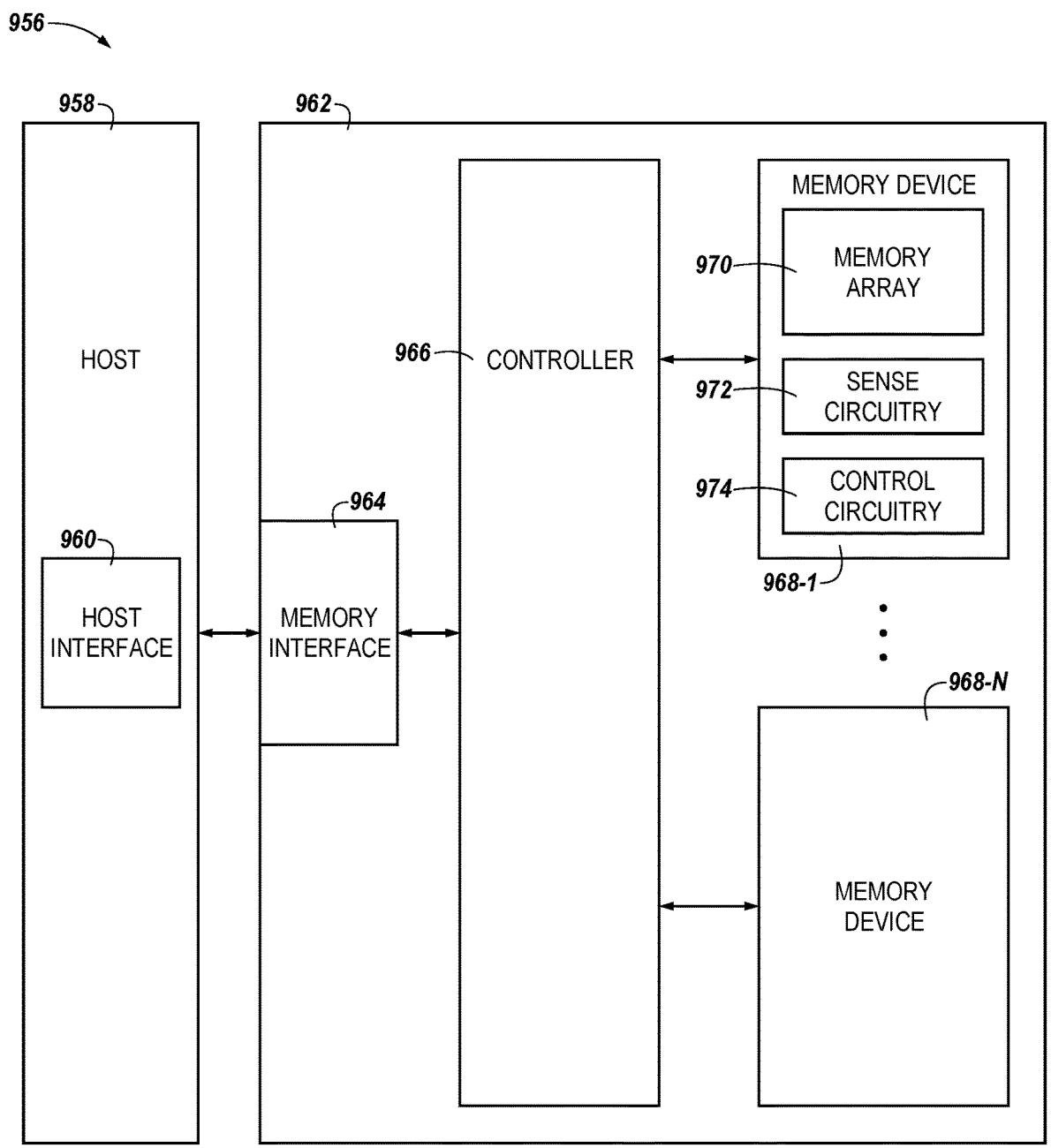
FIG. 9 is a functional block diagram of a computing system including at least one memory array having electrodes formed in accordance with a number of embodiments of the present disclosure.

FIG. 9 is a functional block diagram of a computing system 956 including at least one memory system 962 in accordance with one or more embodiments of the present disclosure. The numbering convention used in connection with FIG. 9 does not follow the earlier introduced numbering convention and sequence that applies to FIGS. 1-7. Memory system 962 may be, for example, a solid-state drive (SSD).

In the embodiment illustrated in FIG. 9, memory system 962 includes a memory interface 964, a number of memory devices 968-1, . . . , 968-N, and a controller 966 selectably coupled to the memory interface 964 and memory devices 968-1, . . . , 968-N. Memory interface 964 may be used to communicate information between memory system 962 and another device, such as a host 958. Host 958 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, PDAs, memory card readers, interface hubs, and the like. Such a host 958 may be associated with fabrication operations performed on semiconductor devices and/or SSDs using, for example, a processing apparatus shown at 851 and described in connection with FIG. 8.

In a number of embodiments, host 958 may be associated with (e.g., include or be coupled to) a host interface 960. The host interface 960 may enable input of scaled preferences (e.g., in numerically and/or structurally defined gradients) to define, for example, critical dimensions (CDs) of a final structure or intermediary structures of a memory device (e.g., as shown at 968) and/or an array of memory cells (e.g., as shown at 970) formed thereon to be implemented by the processing apparatus 851. The array includes storage nodes having top electrodes formed according to embodiments described herein. The scaled preferences may be provided to the host interface 960 via input of a number of preferences stored by the host 958, input of preferences from another storage system (not shown), and/or input of preferences by a user (e.g., a human operator).

Memory interface 964 may be in the form of a standardized physical interface. For example, when memory system 962 is used for information (e.g., data) storage in computing system 956, memory interface 964 may be a serial advanced technology attachment (SATA) interface, a peripheral component interconnect express (PCIe) interface, or a universal serial bus (USB) interface, among other physical connectors and/or interfaces. In general, however, memory interface 964 may provide an interface for passing control, address, information, scaled preferences, and/or other signals between the controller 966 of memory system 962 and a host 958 (e.g., via host interface 960).

Controller 966 may include, for example, firmware and/or control circuitry (e.g., hardware). Controller 966 may be operably coupled to and/or included on the same physical device (e.g., a die) as one or more of the memory devices 968-1, . . . , 968-N. For example, controller 966 may be, or may include, an ASIC as hardware operably coupled to circuitry (e.g., a printed circuit board) including memory interface 964 and memory devices 968-1, . . . , 968-N. Alternatively, controller 966 may be included on a separate physical device that is communicatively coupled to the physical device (e.g., the die) that includes one or more of the memory devices 968-1, . . . , 968-N.

Controller 966 may communicate with memory devices 968-1, . . . , 968-N to direct operations to sense (e.g., read), program (e.g., write), and/or erase information, among other functions and/or operations for management of memory cells. Controller 966 may have circuitry that may include a number of integrated circuits and/or discrete components. In a number of embodiments, the circuitry in controller 966 may include control circuitry for controlling access across memory devices 968-1, . . . , 968-N and/or circuitry for providing a translation layer between host 958 and memory system 962.

Memory devices 968-1, . . . , 968-N may include, for example, a number of memory arrays 970 (e.g., arrays of volatile and/or non-volatile memory cells). For instance, memory devices 968-1, . . . , 968-N may include arrays of memory cells, such as a portion of an example memory device structured to include sense line contacts. At least one array includes an access device having a gate structure formed according to the embodiments disclosed herein. As will be appreciated, the memory cells in the memory arrays 970 of memory devices 968-1, . . . , 968-N may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory device 968 may be formed on the same die. A memory device (e.g., memory device 968-1) may include one or more arrays 970 of memory cells formed on the die. A memory device may include sense circuitry 972 and control circuitry 974 associated with one or more arrays 970 formed on the die, or portions thereof. The sense circuitry 972 may be utilized to determine (sense) a particular data value (e.g., 0 or 1) that is stored at a particular memory cell in a row of an array 970. The control circuitry 974 may be utilized to direct the sense circuitry 972 to sense particular data values, in addition to directing storage, erasure, etc., of data values in response to a command from host 958 and/or host interface 960. The command may be sent directly to the control circuitry 974 via the memory interface 964 or to the control circuitry 974 via the controller 966.

The embodiment illustrated in FIG. 9 may include additional circuitry that is not illustrated so as not to obscure embodiments of the present disclosure. For example, memory device 968 may include address circuitry to latch address signals provided over I/O connectors through I/O circuitry. Address signals may be received and decoded by a row decoder and a column decoder to access a memory array 970. It will be appreciated that the number of address input connectors may depend on the density and/or architecture of memory devices 968 and/or memory arrays 970.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, may include a wireless connection for access to and/or for movement (transmission) of instructions (e.g., control signals, address signals, etc.) and data, as appropriate to the context.

While example embodiments including various combinations and configurations of semiconductor materials, underlying materials, structural materials, dielectric materials, capacitor materials, substrate materials, silicate materials, nitride materials, buffer materials, etch chemistries, etch processes, solvents, memory devices, memory cells, openings, among other materials and/or components related to patterning a material over an active area for a sense line contact, have been illustrated and described herein, embodiments of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches related to patterning a material over an active area for a sense line contact than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a bottom electrode of a storage node;
   a dielectric material of the storage node formed over the bottom electrode;
   a first portion of a top electrode of the storage node formed over the dielectric material, wherein the first portion of the top electrode has a first thickness;
   a first metal oxide formed over the first portion of the top electrode, wherein the first metal oxide is a discontinuous layer separating the first portion of the top electrode from a second portion of the top electrode such that the first portion of the top electrode contacts the second portion of the top electrode through gaps in the first metal oxide;
   the second portion of the top electrode formed over the first metal oxide, wherein the second portion of the top electrode has a second thickness;
   a second metal oxide formed over the second portion of the top electrode, wherein the second metal oxide is a discontinuous layer separating the second portion of the top electrode from a third portion of the top electrode such that the second portion of the top electrode contacts the third portion of the top electrode through gaps in the second metal oxide; and
   the third portion of the top electrode formed over the second metal oxide, wherein the third portion of the top electrode has a third thickness.

2. The apparatus of claim 1, wherein the top electrode is a titanium nitride (TiN) electrode to the storage node that is a capacitor cell.

3. The apparatus of claim 1, wherein the first metal oxide is aluminum oxide (AlOx).

4. The apparatus of claim 1, wherein the first metal oxide is formed to a thickness in a range ten percent (10%) to fifteen percent (15%) of a thickness of the top electrode.

5. The apparatus of claim 1, wherein first the metal oxide is positioned in a first distinct area of the top electrode and the second metal oxide is positioned in a second distinct area of the top electrode.

6. The apparatus of claim 1, wherein the dielectric material is a high dielectric constant (k) material.

7. A method comprising:
   depositing a bottom electrode of a storage node to a memory cell;
   depositing a dielectric material of the storage node to the memory cell over the bottom electrode;
   depositing a first portion of a top electrode of the storage node to the memory cell over the dielectric material, wherein the first portion of the top electrode has a first thickness;
   depositing a first metal oxide over the first portion of the top electrode, wherein the first metal oxide is a discontinuous layer separating the first portion of the top electrode from a second portion of the top electrode such that the first portion of the top electrode contacts the second portion of the top electrode through gaps in the first metal oxide;
   depositing the second portion of the top electrode over the first metal oxide, wherein the second portion of the top electrode has a second thickness;
   depositing a second metal oxide over the second portion of the top electrode, wherein the second metal oxide is a discontinuous layer separating the second portion of the top electrode and a third portion of the top electrode such that the second portion of the top electrode contacts the third portion of the top electrode through gaps in the second metal oxide; and
   depositing the third portion of the top electrode over the second metal oxide, wherein the third portion of the top electrode has a third thickness.

8. The method of claim 7, further comprising depositing the top electrode to a thickness in a range of 0-40 Angstroms (Å).

9. The method of claim 7, further comprising depositing the first metal oxide to a thickness in a range of 0-5 Å.

10. The method of claim 7, further comprising depositing the first metal oxide and the second metal oxide using atomic layer deposition (ALD).

11. The method of claim 7, further comprising depositing the first metal oxide and the second metal oxide using multiple cycles of atomic layer deposition (ALD).

12. The method of claim 7, further comprising depositing the first metal oxide and the second metal oxide using a conformal deposition.

13. The method of claim 7, further comprising depositing the first metal oxide and the second metal oxide using chemical vapor deposition (CVD).

14. The method of claim 7, further comprising forming the dielectric material out of a zirconium based material.

15. The method of claim 7, further comprising depositing the first metal oxide in-situ together with depositing the first and the second portion of the top electrode.

16. The method of claim 7, wherein:
   the first portion of the top electrode is deposited in-situ;
   the first metal oxide is deposited ex-situ; and
   the second portion of the top electrode is deposited in-situ.

17. A system comprising:
   a storage node of a memory cell, the storage node comprising:
      a bottom electrode;
      a first dielectric material formed on the bottom electrode;
      a first portion of a top electrode formed on the first dielectric material, wherein the first portion of the top electrode has a first thickness;
      a first metal oxide formed on the first portion of the top electrode, wherein the first metal oxide is a discontinuous layer separating the first portion of the top electrode from a second portion of the top electrode such that the first portion of the top electrode contacts the second portion of the top electrode through gaps in the first metal oxide;
      the second portion of the top electrode formed on the first metal oxide, wherein the second portion of the top electrode has a second thickness;
      a second metal oxide formed on the second portion of the top electrode, wherein the second metal oxide is a discontinuous layer separating the second portion of the top electrode and a third portion of the top electrode such that the second portion of the top electrode contacts the third portion of the top electrode through gaps in the second metal oxide; and the third portion of the top electrode formed on the second metal oxide, wherein the third portion of the top electrode has a third thickness, and wherein the first first portion of the top electrode and the dielectric material.

18. The system of claim 17, wherein the storage node is coupled to a buried recessed access device (BRAD).

* * * * *